(12) United States Patent
Kuo et al.

(10) Patent No.: US 10,985,297 B2
(45) Date of Patent: Apr. 20, 2021

(54) PACKAGE OF PHOTOELECTRIC DEVICE

(71) Applicants: Industrial Technology Research Institute, Hsinchu (TW); Intellectual Property Innovation Corporation, Hsinchu (TW)

(72) Inventors: Yen-Ching Kuo, Keelung (TW); Chien-Chang Hung, Hsinchu (TW); Jane-Hway Liao, Hsinchu County (TW); Yi-Hsiang Huang, Changhua County (TW); Shu-Tang Yeh, Taichung (TW); Hong-Ming Dai, Tainan (TW); Hung-Yi Chen, New Taipei (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 16/423,131

(22) Filed: May 27, 2019

(65) Prior Publication Data
US 2020/0119240 A1   Apr. 16, 2020

Related U.S. Application Data

(60) Provisional application No. 62/744,662, filed on Oct. 12, 2018.

(30) Foreign Application Priority Data

Feb. 25, 2019 (TW) .................. 108106381

(51) Int. Cl.
H01L 33/56 (2010.01)
H01L 33/50 (2010.01)
H01L 33/60 (2010.01)

(52) U.S. Cl.
CPC .............. *H01L 33/56* (2013.01); *H01L 33/50* (2013.01); *H01L 33/60* (2013.01);
(Continued)

(58) Field of Classification Search
CPC combination set(s) only.
See application file for complete search history.

(56) References Cited

U.S. PATENT DOCUMENTS

| 6,673,254 B1 | 1/2004 | Marshall et al. |
| 9,484,504 B2 | 11/2016 | Bibl et al. |

(Continued)

FOREIGN PATENT DOCUMENTS

| CN | 102820405 | 12/2012 |
| CN | 103915545 | 7/2014 |

(Continued)

OTHER PUBLICATIONS

"Office Action of Taiwan Counterpart Application," dated Jul. 22, 2019, p. 1-p. 6.

(Continued)

*Primary Examiner* — Moin M Rahman
(74) *Attorney, Agent, or Firm* — JCIPRNET

(57) ABSTRACT

A package of photoelectric device including a substrate, at least one photoelectric device, a first barrier layer, a wavelength-converting layer, and a second barrier layer is provided. The photoelectric device is disposed on the substrate. The first barrier layer is disposed on the substrate and covers the photoelectric device. The wavelength-converting layer is disposed on the first barrier layer. The second barrier layer covers the wavelength-converting layer. A composition of the first barrier layer includes a nitrogen content of more than 0 atomic percent (at %) to 10 at %, an oxygen content of 50 at % to 70 at %, and a silicon content of 30 at % to 50 at %.

12 Claims, 13 Drawing Sheets

(52) U.S. Cl.
CPC ............... *H01L 2933/005* (2013.01); *H01L 2933/0041* (2013.01); *H01L 2933/0058* (2013.01)

(56) References Cited

U.S. PATENT DOCUMENTS

| | | |
|---|---|---|
| 9,708,532 B2 | 7/2017 | Vo et al. |
| 9,865,577 B2 | 1/2018 | Bibl et al. |
| 2003/0124318 A1 | 7/2003 | Magill et al. |
| 2007/0194297 A1 | 8/2007 | McCarthy et al. |
| 2007/0264836 A1* | 11/2007 | Chen ............... H01L 21/28202 438/736 |
| 2013/0126932 A1* | 5/2013 | Chen ............... H01L 51/5256 257/99 |
| 2014/0151656 A1* | 6/2014 | Zeng ............... C23C 16/45525 257/40 |
| 2014/0339495 A1 | 11/2014 | Bibl et al. |
| 2015/0219288 A1 | 8/2015 | An et al. |
| 2016/0226025 A1* | 8/2016 | Chen ............... H01L 51/56 |

FOREIGN PATENT DOCUMENTS

| | | |
|---|---|---|
| CN | 105009319 | 10/2015 |
| CN | 105074943 | 11/2015 |
| CN | 105914224 | 8/2016 |
| CN | 106129228 | 11/2016 |
| CN | 107209299 | 9/2017 |
| JP | 2007201301 | 8/2007 |
| JP | 2013033833 | 2/2013 |
| TW | 201442314 | 11/2014 |
| TW | M566404 | 9/2018 |

OTHER PUBLICATIONS

"Office Action of China Counterpart Application", dated Aug. 4, 2020, p. 1-p. 9.

"Office Action of Taiwan Counterpart Application", dated Jan. 13, 2021, p. 1-p. 6.

\* cited by examiner

PACKAGE OF PHOTOELECTRIC DEVICE

CROSS-REFERENCE TO RELATED APPLICATION

This application claims the priority benefits of U.S. provisional application No. 62/744,662, filed on Oct. 12, 2018, and Taiwan application no. 108106381, filed on Feb. 25, 2019. The entirety of each of the above-mentioned patent applications is hereby incorporated by reference herein and made a part of this specification.

BACKGROUND

Technical Field

The disclosure relates to a package of photoelectric device.

Background

In recent years, research on wavelength-converting materials (e.g., quantum dots and the like) and photoelectric devices (e.g., light emitting devices and the like) gradually draws more and more attentions. The wavelength-converting materials feature concentrated luminescence spectrum, a wide color gamut, and satisfactory color saturation, so that favorable full color display effects may be achieved through combining the wavelength-converting materials with the photoelectric devices. Nevertheless, the wavelength-converting materials are prone to be damaged as affected by heat and/or moisture and oxygen. Therefore, it is an issue to improve the heat and/or moisture and oxygen barrier properties of photoelectric devices having wavelength-converting materials through the packaging technology, so that reliability and lifetime of photoelectric devices can be enhanced.

SUMMARY

An embodiment of the disclosure provides a package of photoelectric device featuring favorable barrier properties.

A package of photoelectric device according to an embodiment of the disclosure includes a substrate, at least one photoelectric device, a first barrier layer, a wavelength-converting layer, and a second barrier layer. The photoelectric device is disposed on the substrate. The first barrier layer is disposed on the substrate and covers the photoelectric device. The wavelength-converting layer is disposed on the first barrier layer. The second barrier layer covers the wavelength-converting layer. A composition of the first barrier layer includes a nitrogen (N) content of more than 0 atomic percent (at %) to 10 at %, an oxygen (O) content of 50 at % to 70 at %, and a silicon (Si) content of 30 at % to 50 at %.

In a package of photoelectric device provided by an embodiment of the disclosure, surfaces of a first barrier layer and a second barrier layer are modified. In this way, the first barrier layer may feature the barrier effect of both thermal resistance and moisture and oxygen resistance, and the second barrier layer covering the wavelength-converting layer features favorable barrier properties, so that the wavelength-converting layer is protected. Therefore, light emitting efficiency of the wavelength-converting layer is less prone to be affected owing to damages caused by heat and/or moisture and oxygen.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
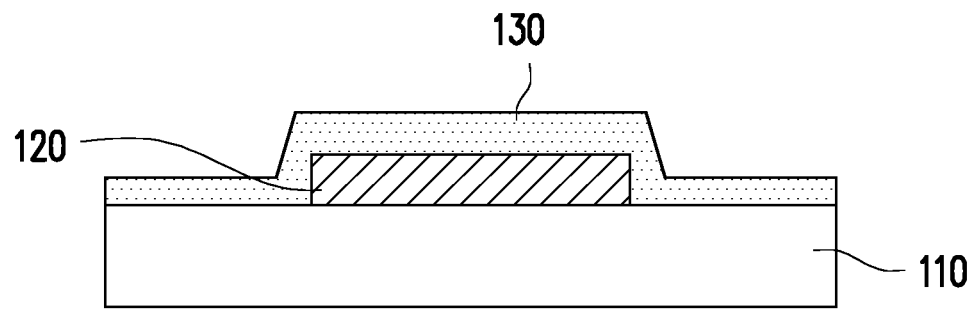
FIG. 1A to FIG. 1G are schematic local cross-sectional views of a manufacturing process of a package of photoelectric device according to a first embodiment of the disclosure.

FIG. 1A to FIG. 1G are schematic local cross-sectional views of a manufacturing process of a package of photoelectric device according to a first embodiment of the disclosure. With reference to FIG. 1A, a substrate 110 is provided first, and the substrate 110 may be a rigid or flexible substrate with a transmittance of visible light. For instance, a material of the rigid substrate is, for example, glass, wafer, or other rigid materials, and a material of the flexible substrate is, for example, polyethylene terephthalate (PET), polyimide (PI), polycarbonate (PC), polyamide (PA), polyethylene naphthalate (PEN), polyethylenimine (PEI), (polyurethane (PU), polydimethylsiloxane (PDMS), an acrylic-based polymer such as polymethylmethacrylate (PMMA) and so forth, an ether-based polymer such as polyethersulfone (PES) or polyetheretherketone (PEEK), polyolefin, thin glass, or other flexible materials. However, the disclosure is not limited thereto.

Next, at least one photoelectric device 120 is formed, and the photoelectric device 120 is disposed on the substrate 110. The photoelectric device 120 may include a light emitting device and the like, and the light emitting device may be, for example, an organic light emitting device, an inorganic light emitting device, a quantum dot light emitting display device, and so forth. The disclosure is not limited thereto. An inorganic light emitting device is taken as an example in the following embodiments.

After the photoelectric device 120 is formed, a first barrier layer 130 may be formed on the substrate 110 and the photoelectric device 120 through a solution process, and the first barrier layer 130 is then cured. The first barrier layer 130 may cover a top surface and a side wall of the photoelectric device 120. A material of the first barrier layer 130 used in the solution process may include, for example, polysilazane, polysiloxazane, or other suitable materials.

Figure 1B:
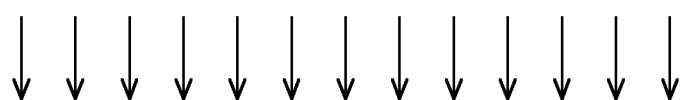
Figure 1B:
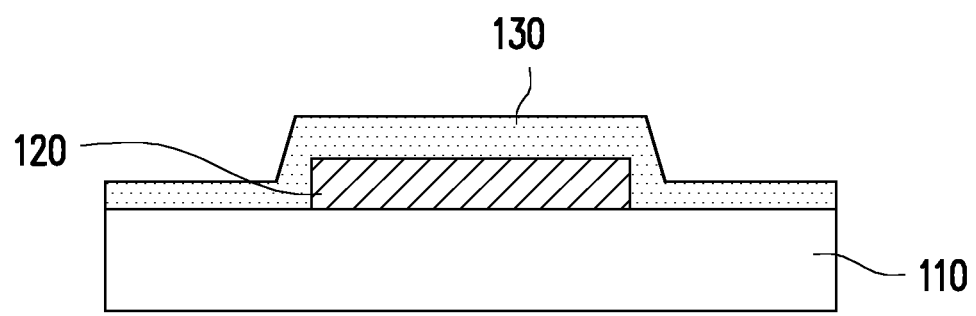

With reference to FIG. 1B, in this embodiment, the cured first barrier layer 130 may be hydrolyzed in the atmosphere, and the level of hydrolysis may be determined according to needs. A surface of the locally hydrolyzed first barrier layer 130 may be modified by performing such as an irradiation, a heating, or a plasma treatment to improve the barrier properties thereof. The irradiation treatment may be performed by using, for example, vacuum ultraviolet light (VUV). The heating treatment may be performed by using, for example, a hot plate and an oven, or the like. The gas used may include, air, nitrogen ($N_2$), oxygen ($O_2$), and so on. The plasma treatment may be performed by using inert gas, hydrogen ($H_2$), nitrogen ($N_2$), oxygen ($O_2$), fluorine-containing gas, chlorine gas ($Cl_2$), and the like for plasma modification. A material of the first barrier layer 130 after the surface modification may include, for example, silicon nitride, silicon oxynitride, or other suitable materials.

In an embodiment, before the first barrier layer 130 is formed, a cover layer (not shown) may be selectively formed on the photoelectric device 120. The method used to form the cover layer may include, for example, ink-jet printing (IJP), plasma-enhanced chemical vapor deposition (PECVD), physical vapor deposition (PVD), sputter deposition, atomic layer deposition (ALD), or other suitable process methods. A material of the cover layer may include, for example, silicon nitride (SiNx), aluminium oxide (AlOx), silicon oxynitride (SiON), indium zinc oxide (IZO), a polymer such as an acrylic material, or other suitable materials. In each embodiment of the disclosure, before the first barrier layer 130 is formed, the cover layer may be selectively formed on the photoelectric device 120.

Figure 1C:
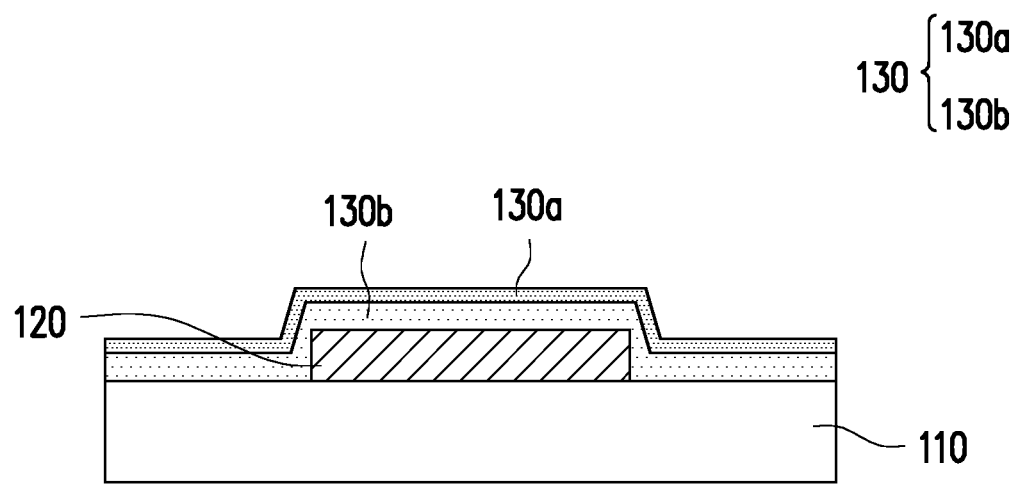

With reference to FIG. 1C next, after the first barrier layer 130 is treated, the first barrier layer 130 having a first area 130a and a second area 130b is formed. A material of the first area 130a is, for example, silicon nitride or silicon oxynitride, and the first area 130a exhibits a greater density than the second area 130b. In an embodiment, the first area 130a may have a greater nitrogen (N) content than the second area 130b. A material of the second area 130b is, for example, silicon oxynitride or silicon oxide. In an embodiment, the second area 130b has a greater oxygen (O) content than the first area 130a. Owing to the moisture and oxygen resistance properties of the material of the first area 130a and the thermal resistance properties of the material of the second area 130b in the first barrier layer 130, the first barrier layer 130 thus features the barrier effect of both thermal resistance and moisture and oxygen resistance. Overall, a composition of the first barrier layer 130 may include, for example, a nitrogen content of more than 0 atomic percent (at %) to 10 at %, an oxygen content of 50 at % to 70 at %, and a silicon (Si) content of 30 at % to 50 at %. A total content of silicon, nitrogen, and oxygen may be 100 at %. The first barrier layer 130 may have a thermal conductivity coefficient of, for example, less than 5 w/m-absolute temperature, a density of, for example, less than 2.2 $g/cm^3$, and a water vapor transmission rate (WVTR) of, for example, less than or equal to $10^{-1}$ $g/m^2$-day.

In an embodiment, a composition analysis may be performed to the first barrier layer 130 through energy dispersive X-ray spectroscopy (EDS), X-ray photoelectron spectroscopy (XPS), or other suitable methods. The energy dispersive X-ray spectroscopy may be attached to equipment such as scanning electron microscopy (SEM) or transmission electron microscopy (TEM) and uses, for example, a line scan or a single point measurement for elemental analysis. The X-ray photoelectron spectroscopy may use, for example, a single point measurement or a depth measurement for elemental analysis, and the composition of the first barrier layer 130 may be known as compared with other elemental composition in the measurement region.

Figure 1D:
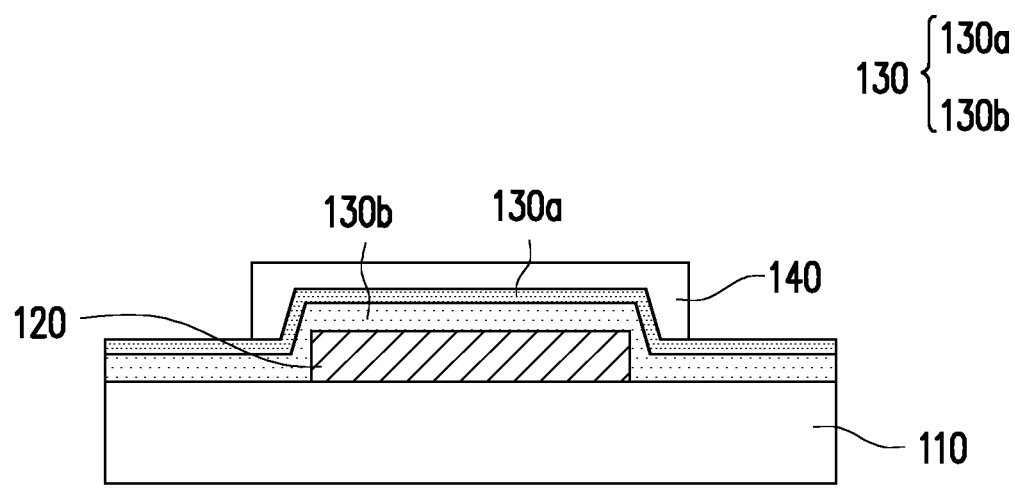

With reference to FIG. 1D, a wavelength-converting layer 140 is then formed on the first barrier layer 130. The method used for forming the wavelength-converting layer 140 may be, for example, ink-jet printing (IJP), the photolithography process, or other suitable processes. The wavelength-converting layer 140 is generally a photoluminescence (PL) material such as a quantum dot (QD) and the like.

Figure 1E:
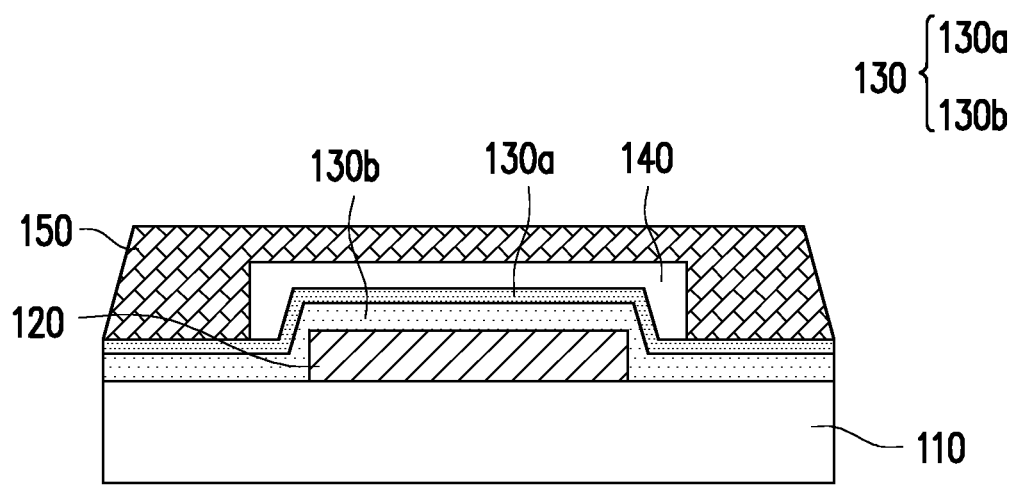

With reference to FIG. 1E, a second barrier layer 150 may be formed on the wavelength-converting layer 140 through the solution process, and the second barrier layer 150 is then cured. The second barrier layer 150 may cover a top surface and a side wall of the wavelength-converting layer 140, and the second barrier layer 150 may have an island-like structure through controlling the process and/or conditions (e.g., a coating area, solution viscosity, etc.). A material of the second barrier layer 150 used in the solution process may include, for example, polysilazane, polysiloxazane, or other suitable materials.

Figure 1F:
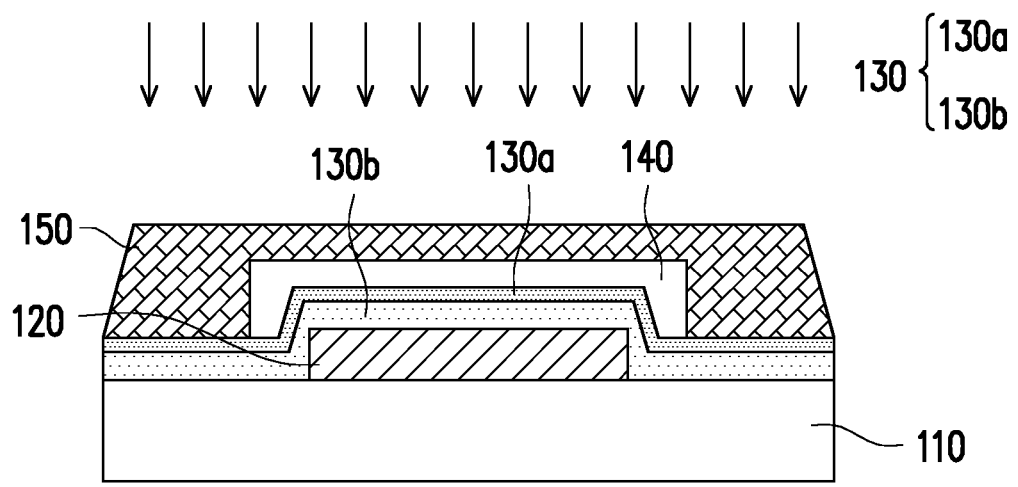

With reference to FIG. 1F, in this embodiment, a top surface and a side surface of the second barrier layer 150 may be modified by performing an irradiation treatment, a heating treatment, or a plasma treatment to improve the barrier properties thereof. A material of the second barrier layer 150 after the modification may include, for example, silicon nitride, silicon oxynitride, or other suitable materials.

Figure 1G:
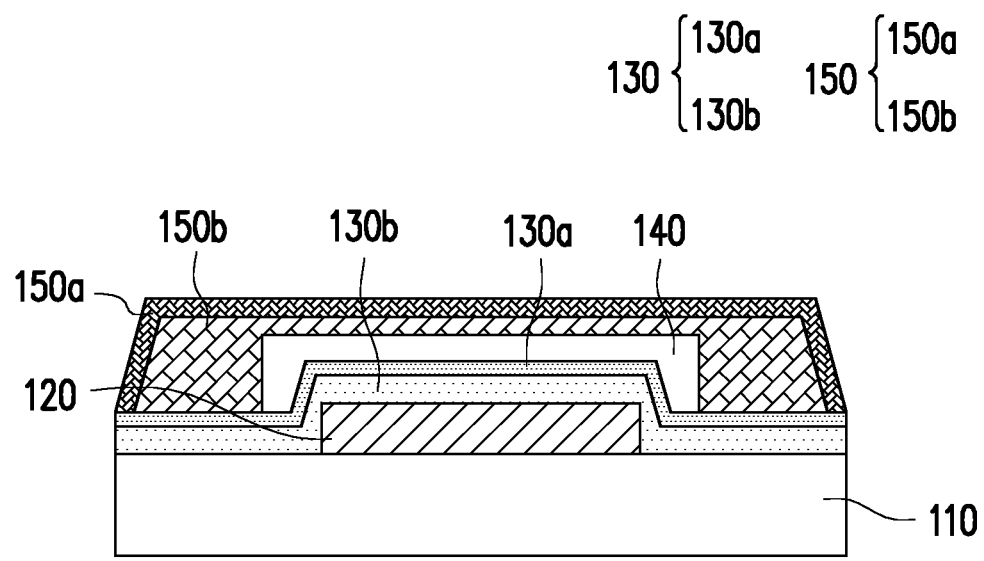

With reference to FIG. 1G next, after the second barrier layer 150 is treated, the second barrier layer 150 having a third area 150a and a fourth area 150b is formed. A material of the third area 150a is, for example, silicon nitride or silicon oxynitride, and the third area 150a thus exhibits a greater density than the fourth area 150b. In an embodiment, the third area 150a may have a greater nitrogen (N) content than the fourth area 150b. A material of the fourth area 150b is, for example, silicon oxynitride. In an embodiment, the fourth area 150b has a greater oxygen (O) content than the third area 150a. With the barrier properties of the material of the third area 150a in the second barrier layer 150, a water vapor transmission rate (WVPR) of the second barrier layer 150 may be, for example, lower than or equal to $10^{-1}$ $g/m^2$-day or lower than or equal to $10^{-2}$ $g/m^2$-day preferably. Overall, a composition of the second barrier layer 150 may include, for example a nitrogen content of 5 at % to 45 at %, an oxygen content of 5 at % to 50 at %, a silicon content of 30 at % to 50 at %. A total content of silicon, nitrogen, and oxygen may be 100 at %. A density of the second barrier layer 150 may be, for example, greater than or equal to 2.2 g/cm³.

In an embodiment, in consideration of flexibility of the package of photoelectric device 100, a Young's modulus of the first barrier layer 130 and/or the second barrier layer may be, for example, 3 Gpa to 10 Gpa. In addition, in other embodiments, similar or identical materials may be used in the solution process to form the first barrier layer 130 and the second barrier layer 150. Different treatments are adopted in the following process based on different functional needs, so that the nitrogen content of the second barrier layer 150 may be greater than the nitrogen content of the first barrier layer 130, the oxygen content of the first barrier layer 130 may be greater than the oxygen content of the second barrier layer 150, a thickness of the first barrier layer 130 may be greater than a thickness of the second barrier layer 150, and the density of the first barrier layer 130 may be greater than the thickness of the second barrier layer 150. Each embodiment of the disclosure may be adjusted by adopting the previous design based on needs.

Figure 2:
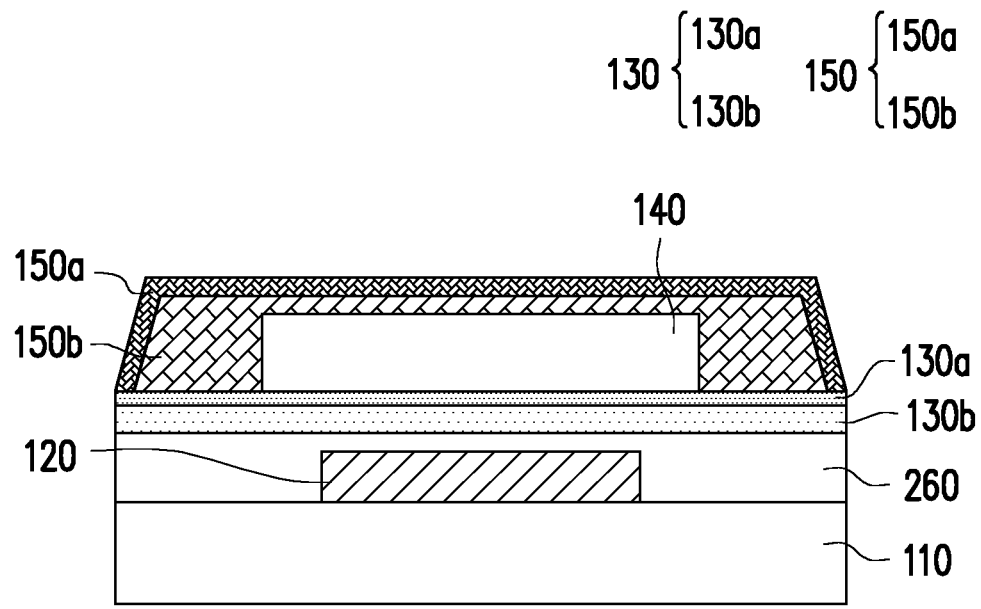
FIG. 2 is a schematic local cross-sectional view of a package of photoelectric device of a second embodiment of the disclosure.

FIG. 2 is a schematic local cross-sectional view of a package of photoelectric device of a second embodiment of the disclosure. A package of photoelectric device 200 of the second embodiment is similar to the package of photoelectric device 100 of FIG. 1G, and the package of photoelectric device 200 is described in this embodiment by adopting FIG. 2. In FIG. 2, identical or similar components are denoted by the same or similar reference numerals, and components which are described in FIG. 1A to FIG. 1G will not be described again hereinafter.

In this embodiment, a planarization layer 260 may be selectively formed on the photoelectric device 120 before the first barrier layer 130 is formed. The method for forming the planarization layer 260 may be, for example, ink-jet printing (IJP), slot die coating, spin coating, or other suitable processes. The planarization layer 260 is disposed between the substrate 110 and the first barrier layer 130 and covers the at least one photoelectric device 120. In each embodiment of the disclosure, before the first barrier layer 130 is formed, the planarization layer 260 may also be selectively formed on the photoelectric device 120.

FIG. 3A to FIG. 3F are schematic local cross-sectional views of a manufacturing process of a package of photoelectric device according to a third embodiment of the disclosure. In FIG. 3A to FIG. 3F, identical or similar components are denoted by the same or similar reference numerals, and components which are described in FIG. 1A to FIG. 1G will not be described again hereinafter.

Figure 3A:
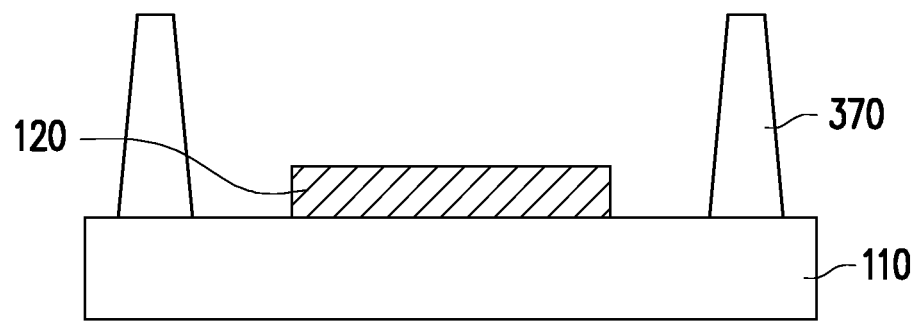
FIG. 3A to FIG. 3F are schematic local cross-sectional views of a manufacturing process of a package of photoelectric device according to a third embodiment of the disclosure.

First, with reference to FIG. 3A, after the photoelectric device 120 is formed, a retaining wall 370 is disposed around the photoelectric device 120. In some embodiments, the cross-section of the retaining wall 370 may have a rectangular shape, a trapezoidal shape, or other suitable shapes. The method for forming the retaining wall 370 may be, but not limited to, spraying, screen printing, microlithography, and low-temperature sintering or other suitable methods.

In one embodiment, a cover layer (not shown) may be selectively formed on the photoelectric device 120 and the area surrounded by the retaining wall 370. The method for forming the cover layer may be, for example, ink-jet printing (IJP). The material of the cover layer may include, for example, an acrylic-based polymer or other suitable materials.

Figure 3B:
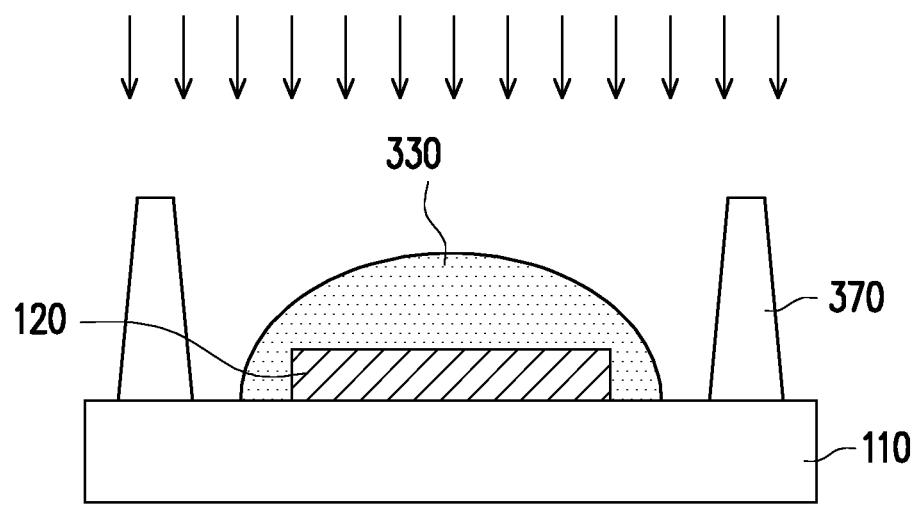

Referring to FIG. 3B next, a first barrier layer 330 may be formed on the photoelectric device 120 and the area surrounded by the retaining wall 370 by, for example, ink jet printing, and then the first barrier layer 330 is cured. The first barrier layer 330 may cover the top surface and the side wall of the photoelectric device 120. A material of the first barrier layer 330 used in the printing process may include, for example, polysilazane, polysiloxazane, or other suitable materials. Next, the cured first barrier layer 330 is hydrolyzed in the atmosphere, and the level of hydrolysis may be determined according to needs. A surface modification may be carried out through an irradiation treatment, a heating treatment, or a plasma treatment to improve the barrier properties of the first barrier layer 330. The irradiation treatment may be performed by using, for example, vacuum ultraviolet light (VUV). The heating treatment may be performed by using, for example, a hot plate and an oven, and the like. The gas used may include, air, nitrogen ($N_2$), oxygen ($O_2$), and so on. The plasma treatment may be performed by using inert gas, hydrogen ($H_2$), nitrogen ($N_2$), oxygen ($O_2$), fluorine-containing gas, chlorine gas ($Cl_2$), and the like for plasma modification. The material of the first barrier layer 330 after the modification may include, for example, silicon nitride, silicon oxynitride, or other suitable materials.

In an embodiment, the first barrier layer 330 may cover top surfaces and side walls of the photoelectric device 120 and the retaining wall 370. The method for forming the first barrier layer 330 may be, for example, ink-jet printing (IJP), slot die coating, spin coating, or other suitable processes.

Figure 3C:
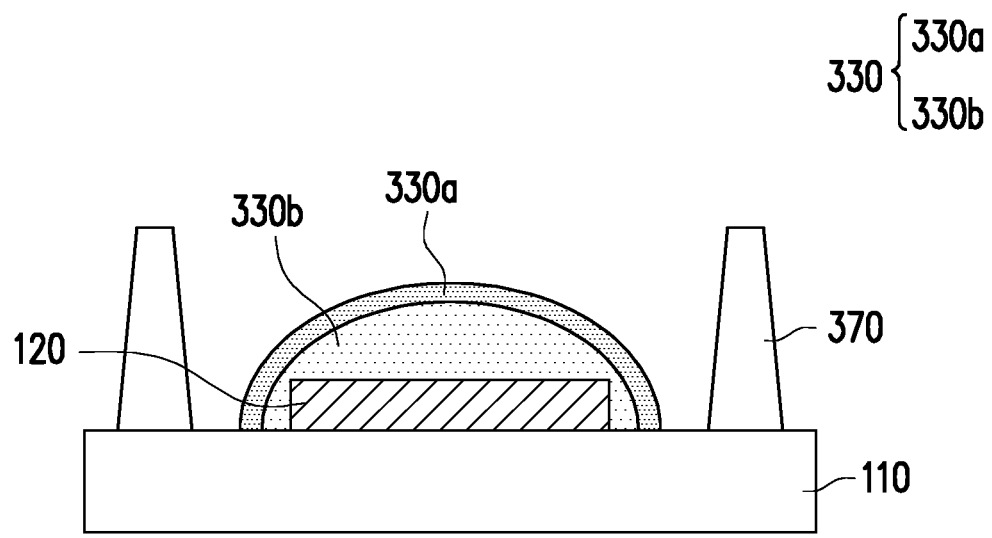

With reference to FIG. 3C, after the first barrier layer 330 is treated, the first barrier layer 330 having a first area 330a and a second area 330b is formed. The material of the first area 330a is, for example, silicon nitride or silicon oxynitride, and the first area 330a exhibits a greater density than the second area 330b. In an embodiment, the first area 330a may have a greater nitrogen (N) content than the second area 330b. A material of the second area 330b is, for example, silicon oxynitride or silicon oxide. In an embodiment, the second area 330b has a greater oxygen (O) content than the first area 330a. Owing to the moisture and oxygen resistance properties of the material of the first area 330a and the thermal resistance properties of the material of the second area 330b in the first barrier layer 330, the first barrier layer 330 thus features the barrier effect of both thermal resistance and moisture and oxygen resistance. Overall, a composition of the first barrier layer 330 may include, for example, a nitrogen content of more than 0 at % to 10 at %, an oxygen content of 50 at % to 70 at %, a silicon content of 30 at % to 50 at %. A total content of silicon, nitrogen, and oxygen may be 100 at %. The first barrier layer 330 may have a thermal conductivity coefficient of, for example, less than 5 w/m-absolute temperature, a density of, for example, less than 2.2 g/cm³, and a water vapor transmission rate (WVTR) of, for example, less than or equal to $10^{-1}$ g/m²-day.

Figure 3D:
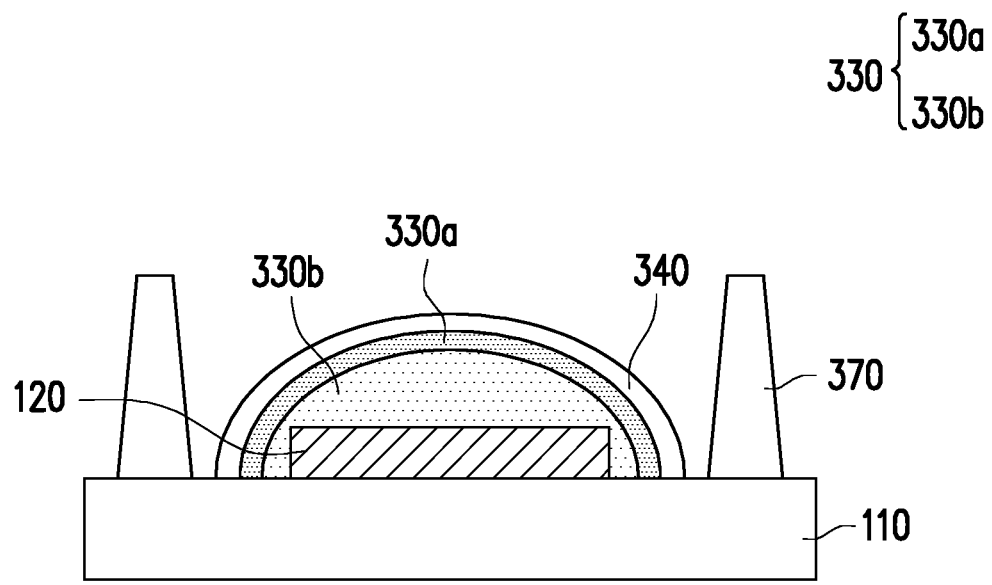

With reference to FIG. 3D, a wavelength-converting layer 340 is formed on the first barrier layer 330 in the area surrounded by the retaining wall 370. The method for forming the wavelength-converting layer 340 may be, for example, ink-jet printing (IJP) or other suitable processes. The wavelength-converting layer 340 is generally a photoluminescence (PL) material such as a quantum dot (QD) and the like.

Figure 3E:
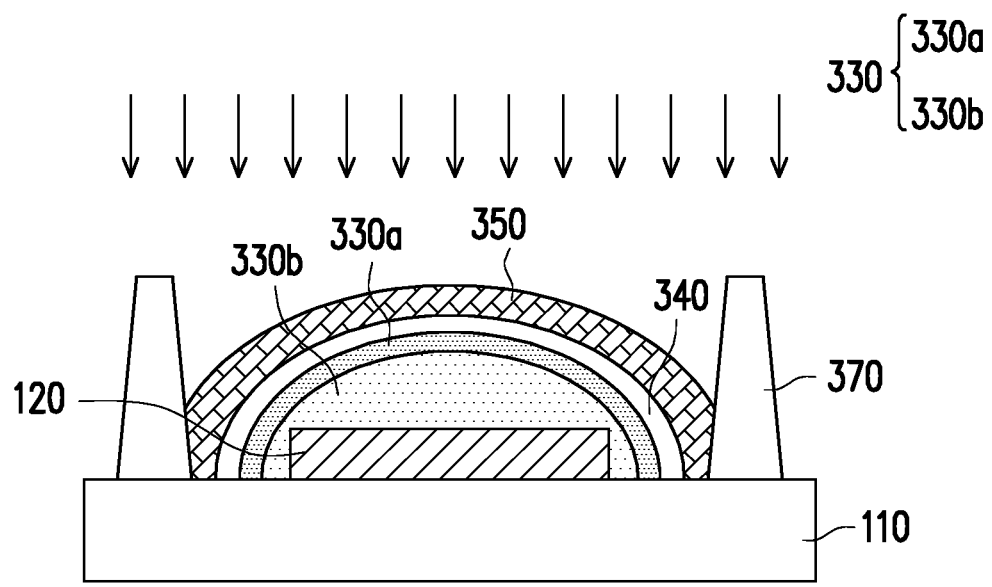

Referring to FIG. 3E, a second barrier layer 350 may be formed on the wavelength-converting layer 340 in the area surrounded by the retaining wall 370 by, for example, ink jet printing, and then the second barrier layer 350 is cured. The second barrier layer 350 may cover a top surface and a side wall of the wavelength-converting layer 340. A material of the second barrier layer 350 used in the printing process may include, for example, polysilazane, polysiloxazane, or other suitable materials. Next, a surface modification may be performed to the cured first barrier layer 330 through an irradiation treatment, a heating treatment, or a plasma treatment to improve the barrier properties of the first barrier layer 330. A material of the second barrier layer 350 after the modification may include, for example, silicon nitride, silicon oxynitride, or other suitable materials.

Figure 3F:
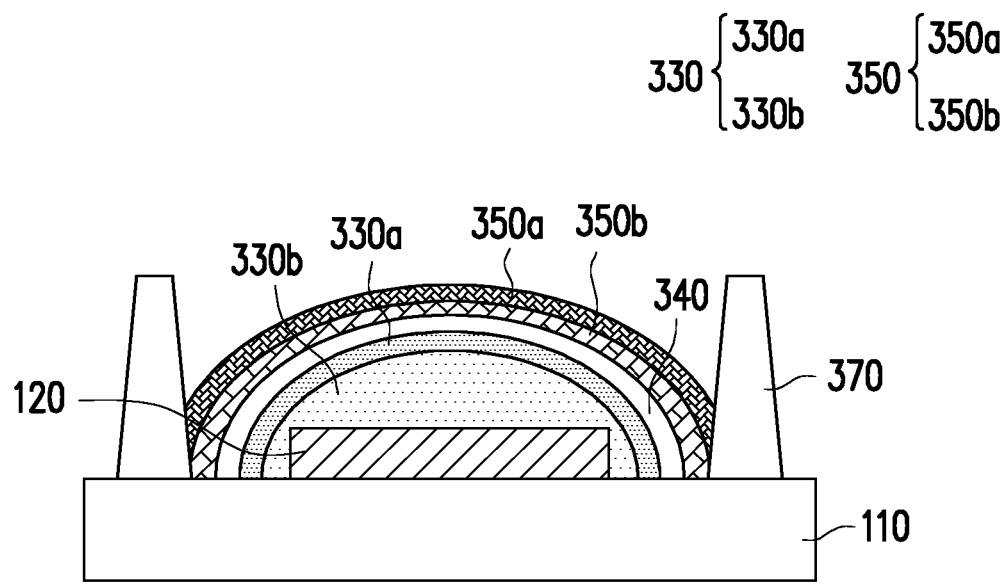

With reference to FIG. 3F next, after the second barrier layer 350 is treated, the second barrier layer 350 having a third area 350a and a fourth area 350b is formed. A material of the third area 350a is, for example, silicon nitride or silicon oxynitride, and the third area 350a exhibits a greater density than the fourth area 350b. In an embodiment, the third area 350a may have a greater nitrogen (N) content than the fourth area 350b. A material of the second area 130b is, for example, silicon oxynitride. In an embodiment, the fourth area 350b has a greater oxygen (O) content than the third area 350a. With the barrier properties of the material of the third area 350a in the second barrier layer 350, a water vapor transmission rate (WVPR) of the second barrier layer 350 may be, for example, lower than or equal to $10^{-1}$ g/m$^2$-day or lower than or equal to $10^{-2}$ g/m$^2$-day preferably. Overall, a composition of the second barrier layer 350 may include, for example a nitrogen content of 5 at % to 45 at %, an oxygen content of 5 at % to 50 at %, a silicon content of 30 at % to 50 at %. A total content of silicon, nitrogen, and oxygen may be 100 at %. A density of the second barrier layer 350 may be, for example, greater than or equal to 2.2 g/cm$^3$.

In addition, in other embodiments, similar or identical materials may be used in the printing process to form the first barrier layer 330 and the second barrier layer 350. Different treatments are adopted in the following process based on different functional needs, so that the nitrogen content of the second barrier layer 350 may be greater than the nitrogen content of the first barrier layer 330, the oxygen content of the first barrier layer 330 may be greater than the oxygen content of the second barrier layer 350, a thickness of the first barrier layer 330 may be greater than a thickness of the second barrier layer 350, and the density of the first barrier layer 330 may be greater than the thickness of the second barrier layer 350.

Figure 4:
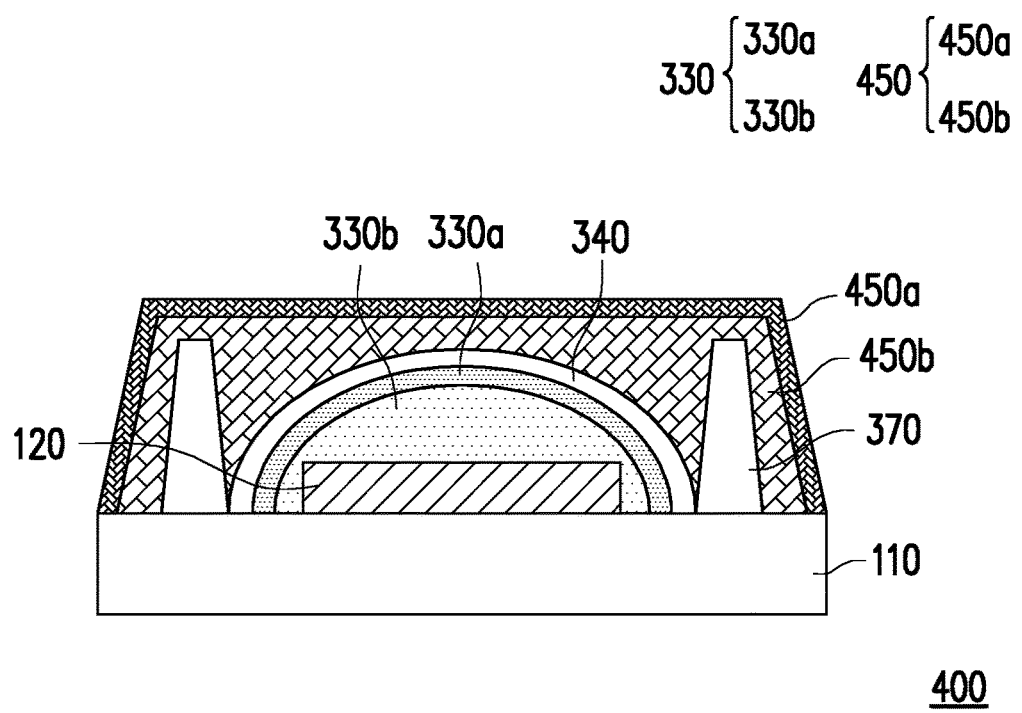
FIG. 4 is a schematic local cross-sectional view of a package of photoelectric device of a fourth embodiment of the disclosure.

FIG. 4 is a schematic local cross-sectional view of a package of photoelectric device of a fourth embodiment of the disclosure. A package of photoelectric device 400 of the fourth embodiment is similar to the package of photoelectric device 300 of FIG. 3F, and the package of photoelectric device 400 is described in this embodiment by adopting FIG. 4. In FIG. 4, identical or similar components are denoted by the same or similar reference numerals, and components which are described in FIG. 3A to FIG. 3F will not be described again hereinafter.

In this embodiment, a second barrier layer 450 of the package of photoelectric device 400 may cover top surfaces and side walls of the wavelength-converting layer 340 and the retaining wall 370, and the second barrier layer 450 may have an island-like structure through controlling the process and/or conditions (e.g., a coating area, solution viscosity, etc.). The method for forming the second barrier layer 450 may be, for example, ink-jet printing (IJP), slot die coating, spin coating, or other suitable processes. Next, a top surface and a side surface of the second barrier layer 450 may be modified by performing an irradiation treatment, a heating treatment, or a plasma treatment to improve the barrier properties of the second barrier layer 450. A material of the second barrier layer 450 after the modification may include, for example, silicon nitride, silicon oxynitride, or other suitable materials.

After the second barrier layer 450 is treated, the second barrier layer 450 having a third area 450a and a fourth area 450b is formed. A material of the third area 450a is, for example, silicon nitride or silicon oxynitride, and the third area 450a thus features a greater density than the fourth area 450b. In an embodiment, the third area 450a may have a greater nitrogen (N) content than the fourth area 450b. A material of the fourth area 450b is, for example, silicon oxynitride. In an embodiment, the fourth area 450b has a greater oxygen (O) content than the third area 450a. With the barrier properties of the material of the third area 450a in the second barrier layer 450, a water vapor transmission rate (WVPR) of the second barrier layer 450 may be, for example, lower than or equal to $10^{-1}$ g/m$^2$-day or lower than or equal to $10^{-2}$ g/m$^2$-day preferably. Overall, a composition of the second barrier layer 450 may include, for example a nitrogen content of 5 at % to 45 at %, an oxygen content of 5 at % to 50 at %, a silicon content of 30 at % to 50 at %. A total content of silicon, nitrogen, and oxygen may be 100 at %. A density of the second barrier layer 450 may be, for example, greater than or equal to 2.2 g/cm$^3$.

Figure 5:
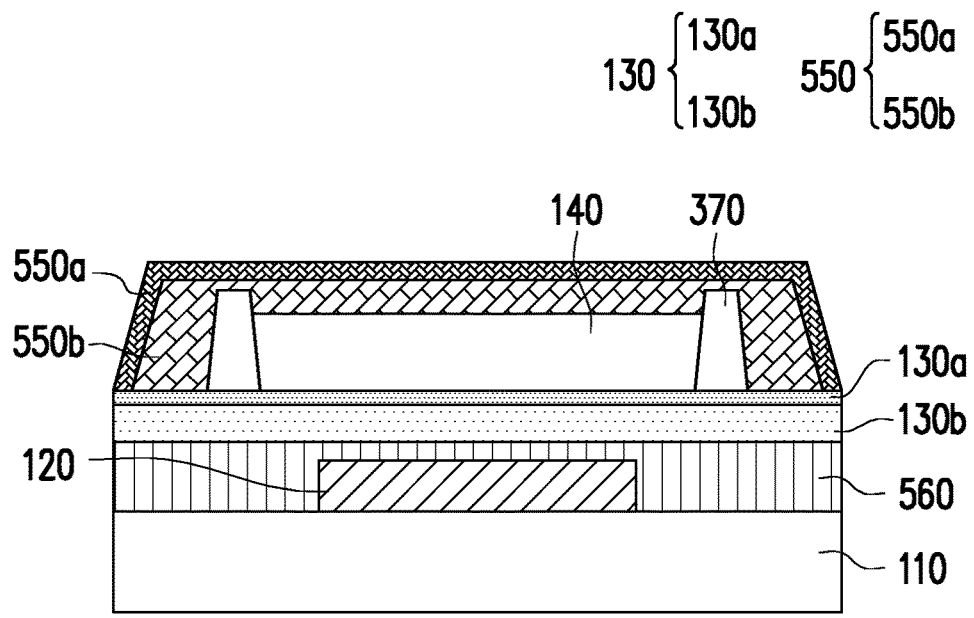
FIG. 5 is a schematic local cross-sectional view of a package of photoelectric device of a fifth embodiment of the disclosure.

FIG. 5 is a schematic local cross-sectional view of a package of photoelectric device of a fifth embodiment of the disclosure. A package of photoelectric device 500 of the fifth embodiment is similar to the package of photoelectric device 200 of FIG. 2, and the package of photoelectric device 500 is described in this embodiment by adopting FIG. 5. In FIG. 5, identical or similar components are denoted by the same or similar reference numerals, and components which are described in FIG. 2 will not be described again hereinafter.

In this embodiment, a planarization layer 560 may be selectively formed on the photoelectric device 120 before the first barrier layer 130 is formed. The method for forming the planarization layer 560 may be, for example, ink-jet printing (IJP), slot die coating, spin coating, or other suitable processes. The planarization layer 560 is disposed between the substrate 110 and the first barrier layer 130 and covers the at least one photoelectric device 120. In each embodiment of the disclosure, before the first barrier layer 130 is formed, the planarization layer 560 may also be selectively formed on the photoelectric device 120.

Next, similar to the method depicted in FIG. 3A, the retaining wall 370 may be correspondingly disposed around the photoelectric device 120, and the wavelength-converting layer 140 is formed on the first barrier layer 130 in the area surrounded by the retaining wall 370. A second barrier layer 550 is formed next. The second barrier layer 550 may cover top surfaces and side walls of the wavelength-converting layer 140 and the retaining wall 370, and the second barrier layer 550 may have an island-like structure through controlling the process and/or conditions (e.g., a coating area, solution viscosity, etc.). The method for forming the second barrier layer 550 may be, for example, ink-jet printing (IJP), slot die coating, spin coating, or other suitable processes.

Next, a top surface and a side surface of the second barrier layer 550 may be modified by performing an irradiation treatment, a heating treatment, or a plasma treatment to improve the barrier properties of the second barrier layer 550. After the second barrier layer 550 is treated, the second barrier layer 550 having a third area 550a and a fourth area 550b is formed. A material of the third area 550a is, for example, silicon nitride or silicon oxynitride, and the third area 550a exhibits a greater density than the fourth area 550b. In an embodiment, the third area 550a may have a greater nitrogen (N) content than the fourth area 550b. A material of the fourth area 550b is, for example, silicon oxynitride. In an embodiment, the fourth area 550b has a greater oxygen (O) content than the third area 550a. With the barrier properties of the material of the third area 550a in the second barrier layer 550, a water vapor transmission rate (WVPR) of the second barrier layer 550 may be, for example, lower than or equal to $10^{-1}$ g/m²-day or lower than or equal to $10^{-2}$ g/m²-day preferably.

Figure 6:
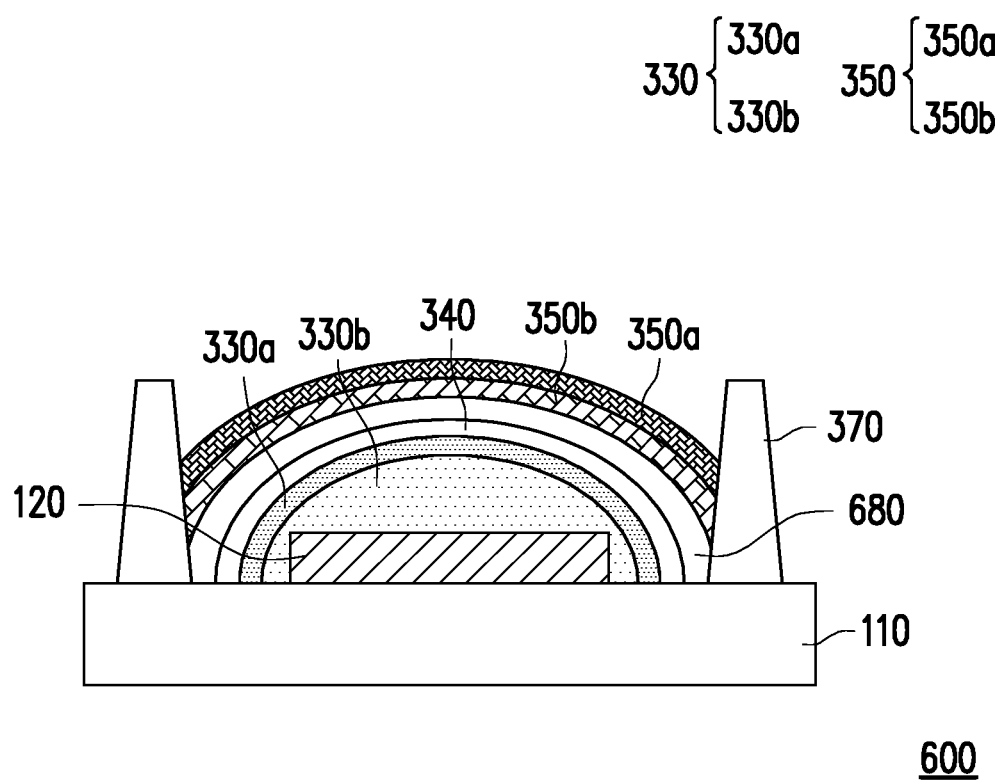
FIG. 6 is a schematic local cross-sectional view of a package of photoelectric device of a sixth embodiment of the disclosure.

FIG. 6 is a schematic local cross-sectional view of a package of photoelectric device of a sixth embodiment of the disclosure. A package of photoelectric device 600 of the sixth embodiment is similar to the package of photoelectric device 300 of FIG. 3F, and the package of photoelectric device 600 is described in this embodiment by adopting FIG. 6. In FIG. 6, identical or similar components are denoted by the same or similar reference numerals, and components which are described in FIG. 3F will not be described again hereinafter.

In this embodiment, a buffer layer 680 may be selectively formed on the wavelength-converting layer 340 before the second barrier layer 350 is formed. The method for forming the buffer layer 680 may be, for example, ink-jet printing (IJP) or other suitable processes. The buffer layer 680 is disposed between the wavelength-converting layer 340 and the second barrier layer 350 and covers the wavelength-converting layer 340. A material of the buffer layer 680 includes an acrylic-based polymer, an epoxy-based polymer, or polyimide. In each embodiment of the disclosure, before the second barrier layer 350 is formed, the buffer layer 680 may also be selectively formed on the wavelength-converting layer 340.

Figure 7:
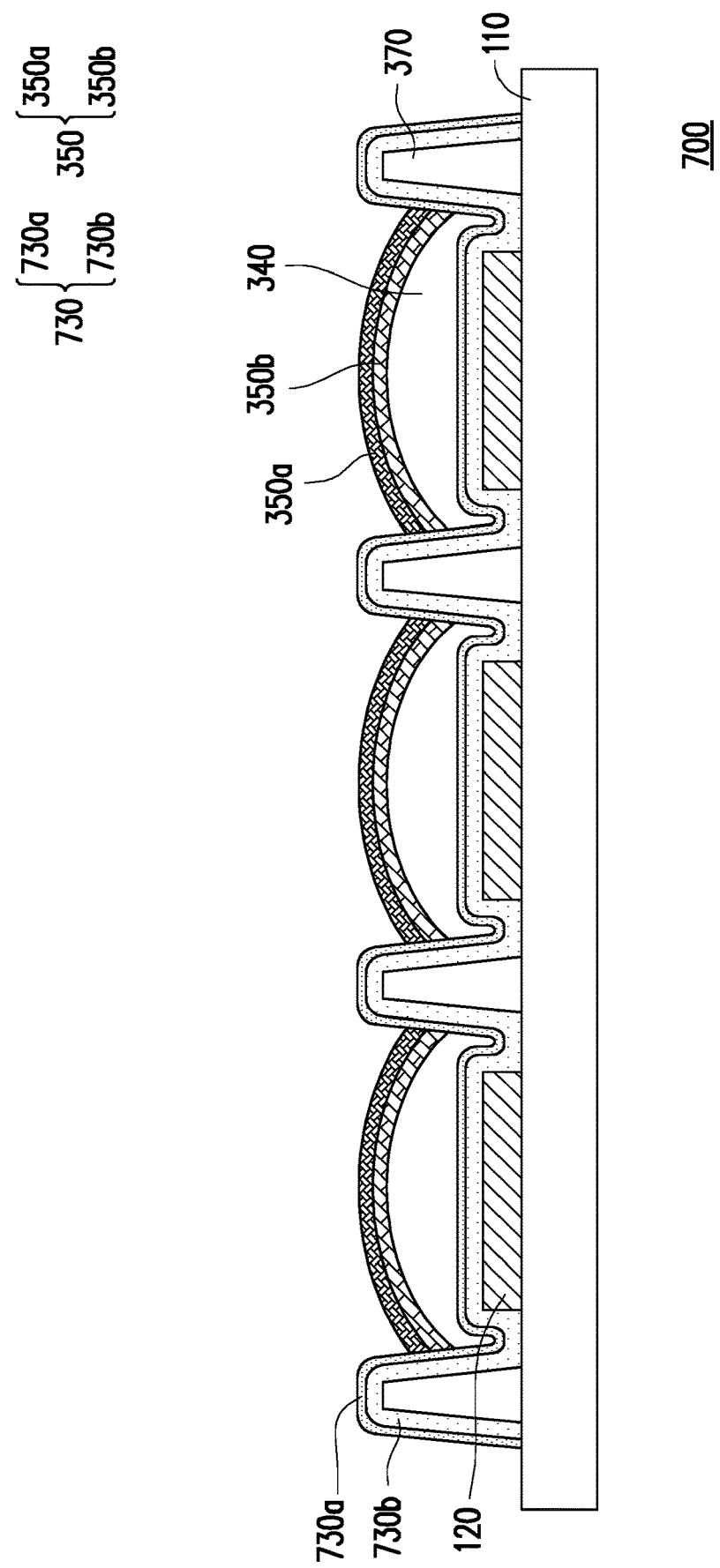
FIG. 7 is a schematic local cross-sectional view of a package of photoelectric device of a seventh embodiment of the disclosure.

FIG. 7 is a schematic local cross-sectional view of a package of photoelectric device of a seventh embodiment of the disclosure. A package of photoelectric device 700 of the seventh embodiment is similar to the package of photoelectric device 300 of FIG. 3F, and the package of photoelectric device 700 is described in this embodiment by adopting FIG. 7. In FIG. 7, identical or similar components are denoted by the same or similar reference numerals, and components which are described in FIG. 3F will not be described again hereinafter.

In this embodiment, the package of photoelectric device 700 may include a plurality of photoelectric devices 120 arranged in an array. A first barrier layer 730 is formed on the photoelectric devices 120, and the first barrier layer 730 is then cured. The first barrier layer 730 may cover top surfaces and side walls of the photoelectric devices 120 and a plurality of retaining walls 370. The method for forming the first barrier layer 730 may be, for example, ink-jet printing (IJP), slot die coating, spin coating, or other suitable processes. Next, the cured first barrier layer 730 is hydrolyzed in the atmosphere, and the level of hydrolysis may be determined according to needs. A surface modification may be carried out through an irradiation treatment, a heating treatment, or a plasma treatment to improve the barrier properties of the first barrier layer 730. A material of the first barrier layer 730 after the modification may include, for example, silicon nitride, silicon oxynitride, or other suitable materials.

After the first barrier layer 730 is treated, the first barrier layer 730 having a first area 730a and a second area 730b is formed. A material of the first area 730a is, for example, silicon nitride or silicon oxynitride, and the first area 730a exhibits a greater density than the second area 730b. In an embodiment, the first area 730a may have a greater nitrogen (N) content than the second area 730b. A material of the second area 730b is, for example, silicon oxynitride or silicon oxide. In an embodiment, the second area 730b has a greater oxygen (O) content than the first area 730a. Owing to the moisture and oxygen resistance properties of the material of the first area 730a and the thermal resistance properties of the material of the second area 730b in the first barrier layer 730, the first barrier layer 730 thus features the barrier effect of both thermal resistance and moisture and oxygen resistance.

Figure 8:
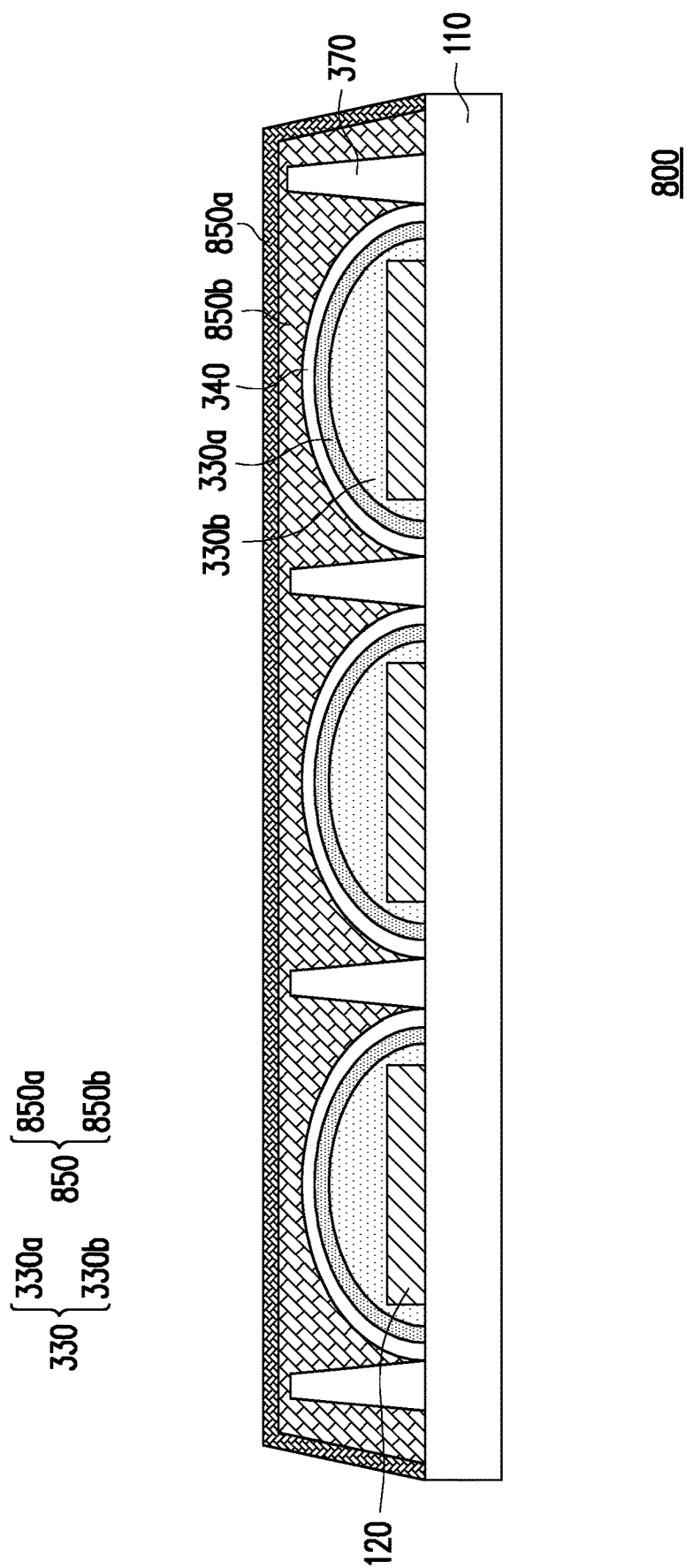
FIG. 8 is a schematic local cross-sectional view of a package of photoelectric device of an eighth embodiment of the disclosure.

FIG. 8 is a schematic local cross-sectional view of a package of photoelectric device of an eighth embodiment of the disclosure. A package of photoelectric device 800 of the eighth embodiment is similar to the package of photoelectric device 400 of FIG. 4, and the package of photoelectric device 800 is described in this embodiment by adopting FIG. 8. In FIG. 8, identical or similar components are denoted by the same or similar reference numerals, and components which are described in FIG. 4 will not be described again hereinafter.

In this embodiment, the package of photoelectric device 800 may include a plurality of photoelectric devices arranged in an array. The second barrier layer 850 may cover top surfaces and side walls of a plurality of wavelength-converting layers 340 and a plurality of retaining walls 370, and the second barrier layer 850 may have an island-like structure through controlling the process and/or conditions (e.g., a coating area, solution viscosity, etc.). The method for forming the second barrier layer 850 may be, for example, ink-jet printing (IJP), slot die coating, spin coating, or other suitable processes. Next, a top surface and a side surface of the second barrier layer 850 may be modified by performing an irradiation treatment, a heating treatment, or a plasma treatment to improve the barrier properties of the second barrier layer 850.

After the second barrier layer 850 is treated, the second barrier layer 850 having a third area 850a and a fourth area 850b is formed. A material of the third area 850a is, for example, silicon nitride or silicon oxynitride, and the third area 850a exhibits a greater density than the fourth area 850b. In an embodiment, the third area 850a may have a greater nitrogen (N) content than the fourth area 850b. A material of the fourth area 850b is, for example, silicon oxynitride. In an embodiment, the fourth area 850b has a greater oxygen (O) content than the third area 850a. With the barrier properties of the material of the third area 850a in the second barrier layer 850, a water vapor transmission rate (WVPR) of the second barrier layer 850 may be, for example, lower than or equal to $10^{-1}$ g/m²-day or lower than or equal to $10^{-2}$ g/m²-day preferably.

The photoelectric devices in the foregoing embodiments are exemplified as inorganic light emitting elements having top light emitting structures and may be replaced by inorganic light emitting elements having bottom light emitting structures. The following embodiment may be referred to for the inorganic light emitting elements having bottom light emitting structures.

Figure 9:
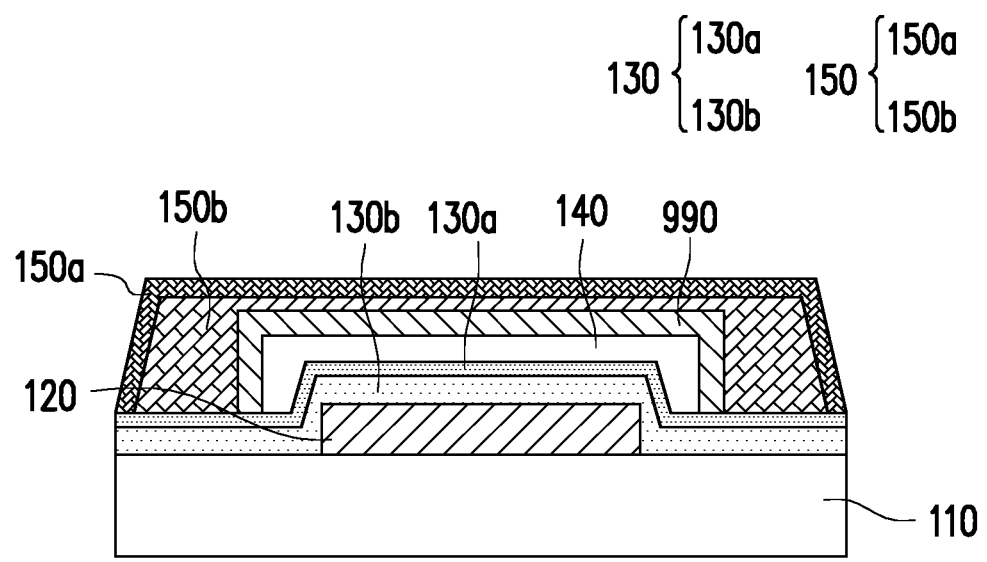
FIG. 9 is a schematic local cross-sectional view of a package of photoelectric device of a ninth embodiment of the disclosure.

FIG. 9 is a schematic local cross-sectional view of a package of photoelectric device of a ninth embodiment of the disclosure. A package of photoelectric device 900 of the ninth embodiment is similar to the package of photoelectric device 100 of FIG. 1G, and the package of photoelectric device 900 is described in this embodiment by adopting FIG. 9. In FIG. 9, identical or similar components are denoted by the same or similar reference numerals, and components which are described in FIG. 1G will not be described again hereinafter.

In this embodiment, the package of photoelectric device 900 may further include a reflection layer 990, and a material of the reflection layer 900 may include, for example, a metal, an alloy, or a polymer. The metal may be, for example, silver (Ag), aluminum (Al), copper (Cu), palladium (Pd), or other suitable metal materials. The alloy may be, for example, a combination of the foregoing metal materials. The polymer may be, for example, a siloxane polymer, an acrylic-based polymer, an epoxy-based polymer, or other suitable materials. The reflection layer 990 may be disposed between the wavelength-converting layer 140 and the second barrier layer 150. Luminance of the package of photoelectric device 900 may be increased through the reflection layer 990.

Figure 10:
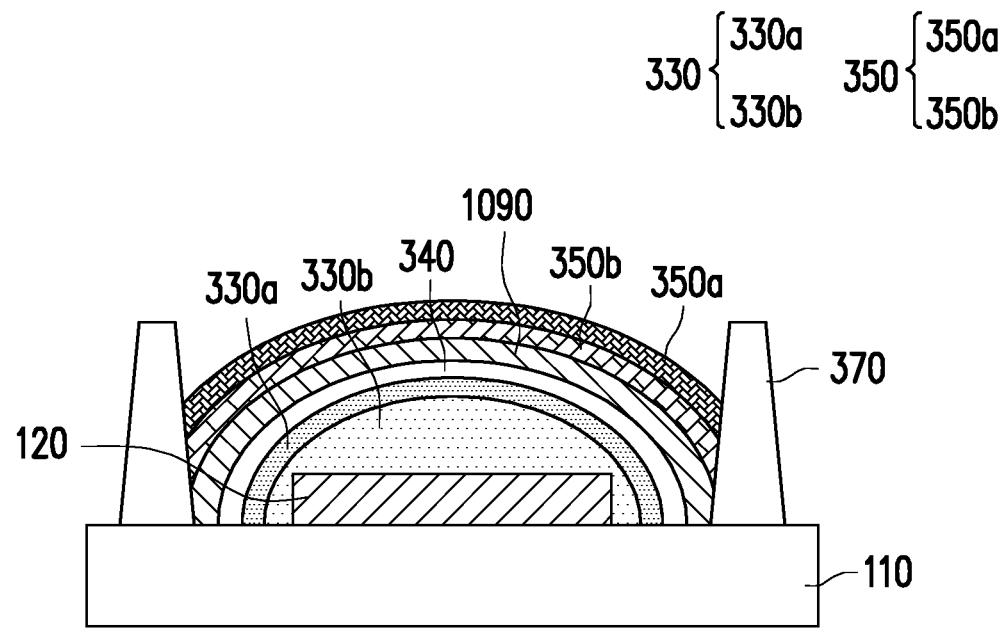
FIG. 10 is a schematic local cross-sectional view of a package of photoelectric device of a tenth embodiment of the disclosure.

FIG. 10 is a schematic local cross-sectional view of a package of photoelectric device of a tenth embodiment of the disclosure. A package of photoelectric device 1000 of the tenth embodiment is similar to the package of photoelectric device 300 of FIG. 3F, and the package of photoelectric device 1000 is described in this embodiment by adopting FIG. 10. In FIG. 10, identical or similar components are denoted by the same or similar reference numerals, and components which are described in FIG. 3F will not be described again hereinafter.

In this embodiment, the package of photoelectric device 1000 may further include a reflection layer 1090, and a material of the reflection layer 900 may include, for example, a metal, an alloy, or a polymer. The metal may be, for example, silver (Ag), aluminum (Al), copper (Cu), palladium (Pd), or other suitable metal materials. The alloy may be, for example, a combination of the foregoing metal materials. The polymer may be, for example, a siloxane polymer, an acrylic-based polymer, an epoxy-based polymer, or other suitable materials. The reflection layer 1090 may be disposed between the wavelength-converting layer 340 and the second barrier layer 350. Luminance of the package of photoelectric device 1000 may be increased through the reflection layer 1090.

Figure 11:
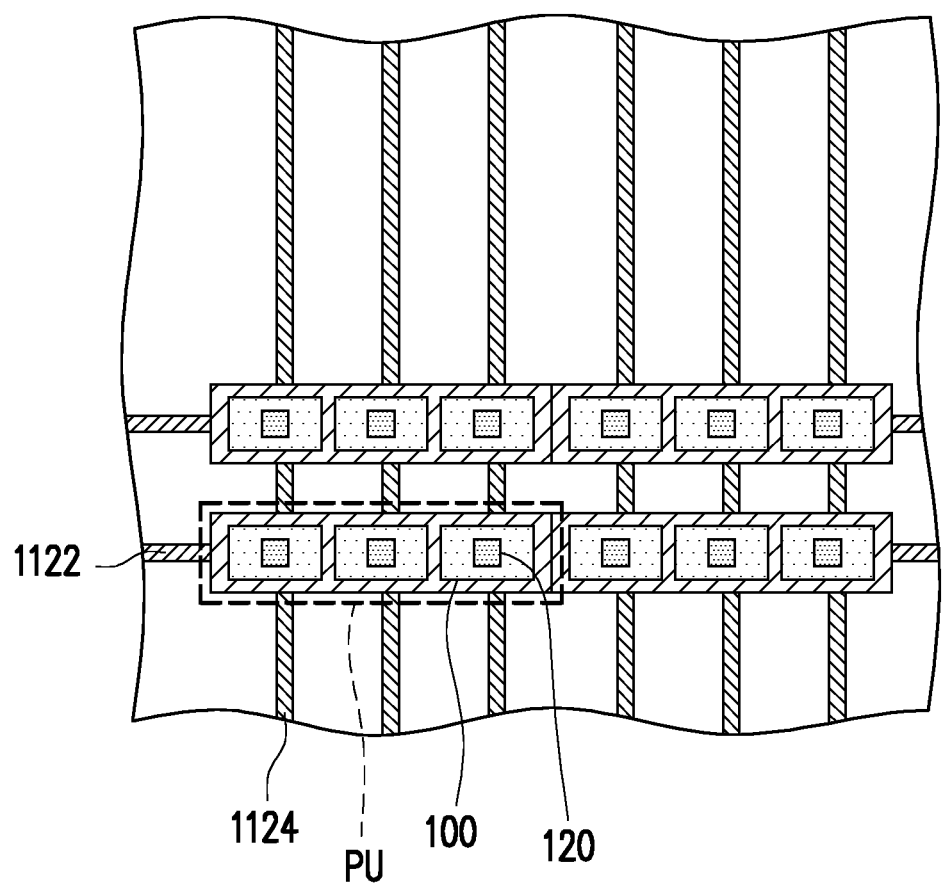
FIG. 11 is a schematic local top view of a package of photoelectric device layout of an embodiment of the disclosure.

FIG. 11 is a schematic local top view of a package of photoelectric device layout of an embodiment of the disclosure. Some film layers and components are omitted in FIG. 11 for clarity. In the following embodiment, a single package of photoelectric device is exemplified as the package of photoelectric device 100, but the disclosure is not limited thereto. In FIG. 11, identical or similar components are denoted by the same or similar reference numerals, and components which are described in FIG. 1G will not be described again hereinafter.

In this embodiment, a package of photoelectric device layout may include a plurality of photoelectric devices 120 and is electrically connected to a first circuit layer 1122 and a second circuit layer 1124. The photoelectric devices 120 may form a pixel unit PU, and a plurality of pixel units PU on the substrate 110 may be arranged in an array, but the disclosure is not limited thereto. A surface modification may be performed on the first barrier layer 130, and that the first barrier layer 130 having a first area 130a and a second area 130b is formed. Owing to the moisture and oxygen resistance properties of the material of the first area 130a and the thermal resistance properties of the material of the second area 130b, the first barrier layer 130 thus features the barrier effect of both thermal resistance and moisture and oxygen resistance. In an embodiment, the first barrier layer 130 may extend to a periphery of the substrate 110 and the first barrier layer 130 forms a continuous film layer, so that the first circuit layer 1122 and/or the second circuit layer 1124 may not open easily during manufacturing. After the second barrier layer 150 is modified and treated, the second barrier layer 150 having a third area 150a and a fourth area 150b is formed. With the barrier properties of a material of the third area 150a, a water vapor transmission rate (WVPR) of the second barrier layer 150 may be, for example, lower than or equal to $10^{-1}$ g/m²-day or lower than or equal to $10^{-2}$ g/m²-day preferably.

In the package of photoelectric device provided by the embodiments of the disclosure, the surfaces of the first barrier layer and the second barrier layer are modified. In this way, the first barrier layer may feature the barrier effect of both thermal resistance and moisture and oxygen resistance, and the second barrier layer covering the wavelength-converting layer features favorable barrier properties, so that the wavelength-converting layer is protected. Therefore, light emitting efficiency of the wavelength-converting layer is less prone to be affected owing to damages caused by heat and/or moisture and oxygen.

It will be clear that various modifications and variations can be made to the disclosure. It is intended that the specification and examples be considered as exemplary embodiments only, with a scope of the disclosure being indicated by the following claims and their equivalents.

What is claimed is:

1. A package of photoelectric device, comprising:
   a substrate;
   at least one photoelectric device, disposed on the substrate;
   a first barrier layer, disposed on the substrate and covering the at least one photoelectric device, wherein the first barrier layer has a first area and a second area between the first area and the at least one photoelectric device, and the first area is different from the second area in a nitrogen content;
   a wavelength-converting layer, disposed on the first barrier layer; and
   a second barrier layer, covering the wavelength-converting layer, wherein a nitrogen content of the second barrier layer is greater than the nitrogen content of the first barrier layer, and the oxygen content of the first barrier layer is greater than an oxygen content of the second barrier layer,
   wherein a composition of the first barrier layer comprises the nitrogen content of more than 0 atomic percent (at %) to 10 at %, an oxygen content of 50 at % to 70 at %, and a silicon content of 30 at % to 50 at %.

2. The package of photoelectric device as claimed in claim 1, wherein the first barrier layer has a thermal conductivity coefficient of less than 5 w/m-absolute temperature and a water vapor transmission rate of less than 10−1 g/m2-day.

3. The package of photoelectric device as claimed in claim 1, wherein a composition of the second barrier layer comprises the nitrogen content of 5 at % to 45 at %, the oxygen content of 5 at % to 50 at %, and a silicon content of 30 at % to 50 at %.

4. The package of photoelectric device as claimed in claim 1, wherein a thickness of the first barrier layer is greater than a thickness of the second barrier layer.

5. The package of photoelectric device as claimed in claim 1, wherein a density of the first barrier layer is less than a density of the second barrier layer.

6. The package of photoelectric device as claimed in claim 1, wherein the package of photoelectric device further comprises at least one retaining wall, and the at least one retaining wall is disposed around the at least one photoelectric device.

7. The package of photoelectric device as claimed in claim 6, wherein the first barrier layer and/or the second barrier layer covers the at least one retaining wall.

8. The package of photoelectric device as claimed in claim 1, wherein the package of photoelectric device further comprises a buffer layer, and the buffer layer is disposed between the wavelength-converting layer and the second barrier layer.

9. The package of photoelectric device as claimed in claim 8, wherein a material of the buffer layer comprises an acrylic-based polymer, an epoxy-based polymer, or polyimide.

10. The package of photoelectric device as claimed in claim 1, wherein the package of photoelectric device further comprises a reflection layer, and the reflection layer is disposed between the wavelength-converting layer and the second barrier layer.

11. The package of photoelectric device as claimed in claim 10, wherein a material of the reflection layer comprises a metal, an alloy, or a polymer.

12. The package of photoelectric device as claimed in claim 1, wherein the package of photoelectric device further comprises a planarization layer, and the planarization layer is disposed between the substrate and the first barrier layer and covers the at least one photoelectric device.

* * * * *